United States Patent [19]

Duncan

[11] Patent Number: 4,560,956
[45] Date of Patent: Dec. 24, 1985

[54] OSCILLATOR WITH CRYSTAL-RESISTIVE FEEDBACK

[75] Inventor: William S. Duncan, Lexington, Ky.

[73] Assignee: International Business Machines Corporation, Armonk, N.Y.

[21] Appl. No.: 536,117

[22] Filed: Sep. 26, 1983

[51] Int. Cl.[4] .............................................. H03B 5/32
[52] U.S. Cl. ................................. 331/116 R; 331/158; 331/DIG. 3
[58] Field of Search ........ 331/108 D, 116 R, 116 FE, 331/158–164, DIG. 3

[56] References Cited

U.S. PATENT DOCUMENTS

| | | | |
|---|---|---|---|
| 3,108,223 | 10/1963 | Hunter. | |
| 3,315,179 | 4/1967 | Whitbread | 331/116 R |
| 3,713,045 | 1/1973 | Usuda et al. | 331/116 R X |
| 3,911,378 | 10/1975 | Buchanan | 331/116 R |
| 4,223,524 | 9/1980 | Nakagawa | 331/176 X |
| 4,513,255 | 4/1985 | Terbrack | 331/158 X |

OTHER PUBLICATIONS

Bennett et al., "Circuits for Space Probes", Electronics, Jun. 19, 1959, pp. 55-57.

Primary Examiner—Siegfried H. Grimm
Attorney, Agent, or Firm—John A. Brady

[57] ABSTRACT

A standard TTL inverter (1) drives a series circuit of an inductor (9) and a capacitor (11). This is fed back through a frequency-control crystal (15). A resistor (19) is also in the feedback circuit, and a resistor 7 bridges the low-current-accepting inverter (1). None of the circuit elements need be of high precision or otherwise expensive.

6 Claims, 1 Drawing Figure

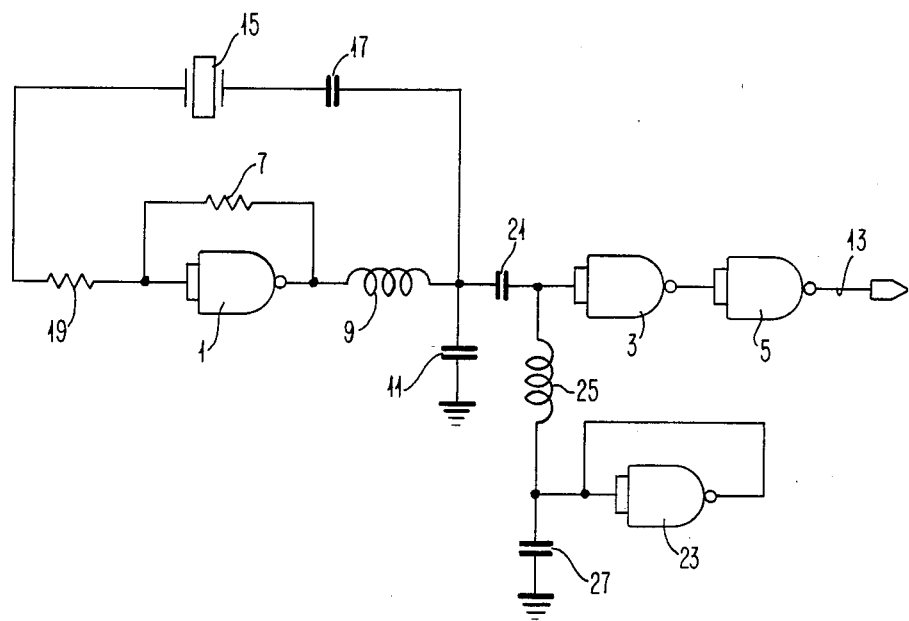

OSCILLATOR WITH CRYSTAL-RESISTIVE FEEDBACK

DESCRIPTION

1. Technical Field

This invention relates to oscillator circuitry having a discrete gain subcircuit and a crystal in the circuit to set the frequency. It is low-cost and reliable so long as the gain is above a minimum level.

2. Background Art

U.S. Pat. No. 3,108,223 to Hunter discloses a circuit which is directly similar to this invention in having an amplifier followed by an inductor-capacitor (LC) tank circuit with a crystal in a feedback loop. It differs significantly in that the amplifier is not a fixed-gain amplifier and in that nothing appears corresponding to the discrete resistor of this invention in the crystal to amplifier-input branch. This patent shows a tank circuit at the input which presumably is to damp harmonic oscillations, a structure which would not be needed with this invention because this invention employs a significant level of resistance in the feedback circuit.

U.S. Pat. No. 4,223,524 to Nakagawa is illustrative of alternative crystal oscillators and of the use of an inverter as an amplifier having a resistor bridging the input and output. Amplification employing an inverter and a resistive bridge connecting the input and output is believed to be a standard, known design alternative. U.S. Pat. No. 3,911,378 to Buchanan is of general interest in that it shows an alternative crystal oscillator employing TTL inverter circuits.

It is known that gain from a system having an inverting amplifier, a resistor bridging the input and output, and a second resistor between the signal to be amplified and the inverting amplifier is limited to a ratio of the resistors. That configuration is employed in this invention and the limitation on overall gain is realized.

DISCLOSURE OF THE INVENTION

A commercially available inverter having some fixed gain may be employed in combination with a resistance in a feedback loop. A resistor bridges the input and output of the inverter. This defines an amplifier having a gain of at least a fixed amount and having a 180 degree phase shift. One end of an inductor is in series with the amplifier output, and a capacitor is connected between ground or a reference voltage and the other end of the inductor. These define a series circuit tuned to provide a second 180 degree phase shift. A crystal is in a feedback circuit between the junction of the inductor and the capacitor and the input of the amplifier. The crystal inherently provides only such reactance as is necessary to compensate for imperfections in the amount of phase shift from the other circuits and to thereby precisely control the frequency of oscillation.

A resistance of at least a predetermined level in the crystal feedback circuit sets the maximum effective amplification to a value set by the bridge resistor divided by the resistance of the feedback circuit. This limits possible excursions of amplification which could result in oscillations at harmonics of the crystal frequency.

The circuit elements employed need not be of high precision and therefore may be generally low-cost and otherwise inexpensive. In addition, the circuit is much more reliable in adverse environments than one which employs, for example, two capacitors across the crystal, thereby imposing on the crystal the function of a substantial inductor. Moreover, the circuit of this invention is completely subject to worst-case analysis, which verifies that spurious oscillations are not possible so long as elements are at least at certain nominal values, although they may vary greatly in one sense away from the nominal values.

BRIEF DESCRIPTION OF THE DRAWING

This invention will be described in connection with the accompanying drawing, which is a circuit diagram in conventional form of this preferred oscillator.

BEST MODE FOR CARRYING OUT THE INVENTION

The preferred circuit is made in standard transistor-to-transistor (TTL) logic technology employing three TTL inverters 1, 3 and 5 in a single module, with the other circuit elements being discrete items connected by conventional soldering or the like.

The TTL module typically is a 74LS00 selected or modified to have a minimum gain specification of at least 3 at frequencies at 15 million cps (MHZ), or less, temperatures of 25° C. or more, loads of reactive 35 ohm or more, and operating voltages of 4.5 volts or more. In the TTL module designation the initial two numbers, 74, specifies temperature range, LS indicates low power, bipolar transistor circuitry and the 00 indicates four separate Not And (NAND) circuits with single available input terminals. Each NAND circuit draws minimal input current, as the input signals are control signals to the base of internal transistors.

Such inverters respond to only positive or negative polarity signals (depending on the basic circuit design) which are a small level above zero volts (termed the threshold, typically about one volt) and above that level. Below threshold, the output is high. As inputs pass above threshold, the output level decreases, thereby providing inversion. All outputs are the same polarity (positive or negative) as the inputs. Further details of actual circuitry elements of the TTL module and of design and operation of the TTL module will not be given as that is not significant to this invention.

Inverter 1 is bridged from input to output by resistor 7, which in this typical specific embodiment is 510 ohms. The output of inverter 1 connects to one end of 1.2 microhenry inductor 9, the other end of inductor 9 is connected to 300 picofarad capacitor 11, the other end of which is connected to a source of reference potential or ground.

The junction of inductor 9 and capacitor 11 is connected to inverters 3 and 5 connected input-to-output in series, to provide a square-wave 12 MHZ signal on line 13, from the output of the final inverter 5. The junction of inductor 9 and capacitor 11 is connected to the crystal 15 through capacitor 17.

Crystal 15 is a standard crystal adapted for frequency control. When operating at its optimum frequency, the series combination of crystal 15 and capacitor 17 has no reactive component and crystal 15 has an internal resistance, Rx, of not more than 75 ohms. As is inherent, the crystal exhibits diminished but similar effects at the odd harmonics, but not the even harmonics. Typical circuit designs in which it is used have some capacitance, and the crystal is therefore fashioned to be at its specified frequency when in a series circuit with specified capacitance. The crystal 15 has a specification calling for 25 picofarads in series, which is supplied by capacitor 17. Also in series with crystal 15 is 51 ohm resistor 19.

Circuit operation is automatic and inherent. Ordinary start-up current resonates in the series circuit of inductor 9 and capacitor 11 and voltages across capacitor 11 pass through the feedback circuit including crystal 15 and resistor 19 to be amplified. The circuit soon builds to steady-state, sinusoidal operation limited by saturation of inverter 1 at which the center of input to inverter 1 stabilizes at a level between threshold and saturation of inverter 1. Ideally a 180° phase shift is provided by inverter 1 and the second 180° phase shift required for feedback reinforcement is supplied by the series circuit of inductor 9 and capacitor 11. Where the frequency is different from the ideal, crystal 15 inherently adapts to the capacitive or inductive reactance necessary to bring the circuit to the optimum frequency. The capacitor 17 functions only to bring crystal 15 to its specified characteristics.

Current through resistor 19 passes through resistor 7 to complete the circuit. The inverters 1, 3 and 5 have connections (not shown) to ground and operating voltages, but since they accept negligible input currents, no significant current from resistor 7 is bypassed through inverter 1. Assuming at least a minimum output reactance, the gain of inverter 1 is substantially fixed, since it does not vary significantly with the load presented to the output of inverter 1 under normal operating conditions. Voltage across capacitor 11 would be maximum when the LC circuit of capacitor 11 and inductor 9 is tuned to the frequency of oscillation, 12 megahertz (MHZ) in this embodiment. However, the load presented to inverter 1 must be inductive to achieve a phase shift of 180 degrees across capacitor 11, an essential in the mechanism of oscillation. Accordingly, the actual size of inductor 9 is selected so that in all places in the range of its tolerances or other variations it will exhibit greater reactance at the resonant frequency than reactance of the capacitor 11 at all places in the range of its tolerance or other variations.

The sine wave developed across capacitor 11 is applied to inverters 3 and 5 to produce a useful, TTL compatable square wave output on line 13. The capacitor 21 in the input of inverter 3 is optional, as discussed below. Assuming capacitor 21 is not in the circuit, at steady state operation, the output to inverter 3 is limited by saturation of inverter 1. As inverter 1 is saturated, inverter 3, connected to the output side of inverter 1, is necessarily more than saturated. Depending on the degree of attenuation in the feedback circuit through resistor 19, inverter 3 may be driven to saturation very early past the center of an increasing cycle of oscillations across inverter 1. Because inverters 1, 3 and 5 are identical and in virtually the same environment, their changes in response should track one another so that early switching of inverter 3 will not be effected by external factors. Inverter 5 provides another phase reversal and serves to further square the output wave. Thus, a square wave is produced which can be high on line 13 during substantially all of the period when inverter 1 is driven higher than the center of a cycle and low when the oscillations are below the center of a cycle.

For applications where symmetry is critical, the input to inverter 3 contains capacitor 21 and inverter 23 connected through inductor 25. Capacitor 21 isolates any direct currents resulting from nonlinearities during saturation of inverter 1. Simultaneously, a direct current signal at the threshold level is applied to the input of inverter 3 through inductor 25. Inverter 23 is the fourth inverter on the TTL module, and has its output connected directly to its input, thereby necessarily having its input at threshold. The input of inverter 23 is connected to the input of inverter 3 through inductor 25, which is large enough to isolate alternating signals to inverter 3 from the low impedance at the input of inverter 23. Once again, inverters 1, 3, 5 and 23 are close together and therefore track changes in the environment together. Since inverters 3 and 23 are otherwise identical, the direct current level at the input of inverter 23 is continually at the threshold of inverter 3. Noise from the inverter 23 is bypassed to ground by capacitor 27 connected to the junction of inductor 25 and the input of inverter 23.

The unique advantages of the foregoing circuit are established by theoretical analysis, which shows that spurious oscillations are excluded under all meaningful probabilities, even where gain is assumed to raise an unlimited amount, while oscillation at the fundamental frequency is assured. The invention therefore may be used with confidence for practical applications where high reliablity is required, even though the elements need not have precise responses and the circuit as a whole may be inexpensive.

GENERAL LOOP GAIN ANALYSIS

Continuous sinusoidal oscillations of a given freqency are realized when gain around the circuit loop at the frequency is greater than one. The circuit can be analyzed employing Thevenin's theory where convenient, which states that a linear network may be replaced analytically by a voltage equal to the open circuit voltage of the network and an impedance measured back into the network with voltage considered zero.

Tracing the oscillator loop, the gain from the input to output of inverter 1 is the gain characteristics of inverter 1, GI. As the signal is inverted, gain is $-GI$.

The part of the circuit between the output of inverter 1 and the junction of inductor 9 and capacitor 11 is replaced by effective elements using Thevenin's theorem. The voltage equivalent, GTh, is the voltage across capacitor 11. This part of the circuit forms a simple voltage bridge of capacitor 11 and inductor 9.

Accordingly, by straightforward circuit analysis of voltage in a series circuit:

$$GTh = \frac{-j/\omega C}{j\omega L - j/\omega C}$$

where:
$\omega$ = Frequency in radians per second
C = Capacitance of capacitor 11
L = Inductance of inductor 9

Simplifying: $GTh = \dfrac{-1}{\omega^2 LC - 1}$

The impedance equivalent, ZTh, with the impedance into the output of inverter 1 being negligibly low, is a common parallel circuit of inductor 9 and capacitor 11. Thus, $$ZTh = \frac{j\omega L \cdot (-j/\omega C)}{j\omega L - j/\omega C}$$

-continued

Simplifying: $ZTh = \dfrac{-j\omega L}{\omega^2 LC - 1}$

The gain from the impedances from around the entire oscillator feedback loop, GR, is a straightforward resistor divider condition, with the gain to the oscillator being that portion appearing on the effective input impedance to inverter 1. Accordingly, where:

Zx=Reactive impedance of crystal 15 and capacitor 17
Rx=Resistive impedance of crystal 15
Rin=Effective input impedance to inverter 1
$R_{19}$=Resistance of resistor 19

$GR = Rin/(ZTh + Zx + Rx + R_{19} + Rin)$

These three elements, GI, GTh, and GR, constitute all elements of gain. The value of GI is that of an active element and ordinarily will be greater than 1. The value of GTh may be greater than one, while GR is composed of passive elements with ZTh in denominator, and therefore is less than 1.

Accordingly, total gain around the oscillator, GLoop, is:

$GLoop = -GI \cdot GTh \cdot GR$

Substituting from the above:

$GLoop = -GI \cdot (-1)/(\omega 2LC - 1) \cdot Rin/(ZTh + Zx + Rx + R_{19} + Rin)$ (Formula A)

Finally, Rin is found by recognizing that it is that effective resistance appearing at the input of inverter 1 resulting in current through resistor 7) since inverter 1 draws negligible current). The voltage at the output of inverter 1 is the voltage at the input, Vin, multiplied by GI. Since the output is inverted, the voltage across resistor 7 is: Vin+GI·Vin. Simplifying: Vin(GI+1). Current, Iin, through resistor 7, where R7 is the resistance of resistor 7, is defined by the voltage divided by resistance.

Specifically: $Iin = Vin(GI+1)/R7$

Effective resistance, Rin, is voltage at the input divided by current at the input.

Specifically:
$Rin = Vin/Vin(GI+1)/R7 = R7/(GI+1)$.

Substituting this into Formula A:

$GLoop = [-GI \cdot (-1)/(\omega^2 LC - 1) \cdot R7/ (GI+1)/[(ZTh + Zx + Rx + R_{19} + R7/(GI+1)]$ (Formula B)

The foregoing Formula B permits confident analysis of the circuit as a whole. Assuming larger and larger values of GI, this has a direct increase in the loop gain (the left numerator term in Formula B), as well as a counter effect from the bridging impedance term (the right numerator term in the formula). These changes in GI tend to cancel, and the overall gain tends to be much the same.

In fact, it is known in the amplifier art and can be shown theoretically that the gain across an inverter amplifier, where bridged by a resistor and where the input must pass through a resistor, is limited by the ratio of the resistance of the bridge resistor divided by the resistance of the input resistor. In this embodiment, those resistors are resistor 7 (R7) and resistor 19 (R19) plus the resistance of crystal 15 (Rx) and maximum gain is $-R7/(R19+Rx)$ (the negative sign reflecting the inversion at amplification). This can be shown theoretically with specific reference to this invention.

Assuming a voltage V1 at the junction of inductor 9 and capacitor 11 when the gain of inverter 1 goes very high, current through R19 and Rx will increase until the voltage drop across R19 and Rx approaches V1, leaving a voltage approaching zero at the input of inverter 1. The current through resistor 19 and crystal 15 to achieve the drop is $V1/(R19+Rx)$. This current necessarily passes through resistor 7, since inverter 1 is a low-current device. Accordingly, the voltage at the output of inverter 1, V2, must be such as supported by that current through resistor 7, while the voltage at the input is zero. Accordingly, $-V2/R7 = V1/(R19+Rx)$. Rearranging to define gain: $V2/V1 = -R7/(R19+Rx)$ Referring once again to Formula B, it will be noted that some of the terms are of less or more significance at or near the predetermined resonant frequency. Zx is ideally zero at resonant frequencies. The value of capacitor 11 and inductor 9 are selected so that $\omega^2 LC$ is substantially greater than one at the resonant frequency. Thus, at or near the resonant frequency the second numerator term, having $\omega^2 LC - 1$ in the denominator, is negative, but selected to be substantially less than GI. The left denominator term has ZTh, similarly having $\omega^2 LC - 1$, but in a manner to decrease the denominator as $\omega^2 LC$ increases. The effect of $\omega^2 LC - 1$ in the left denominator term is generally opposite to that in the second numerator term. No dramatic overall effect of stability is indicated. In fact, as discussed above, overall gain is limited to the ratio: $R7/R19 + Rx$.

It will be apparent from the foregoing considerations of Formula B that the circuit is very tolerant of imprecision in circuit values. For specific circuit values having set ranges, computation of the range of other values will show that no close tolerance or other high precision is required to assure oscillations, provided the gain of inverter 1 is somewhat more than the minimum nominally required.

With regard to harmonics, crystal 15 and other crystals normally have no even harmonic effect. At the first odd harmonic, the second term in Formula B has a denominator: $9\omega^2 LC - 1$. This represents a dramatic drop in gain. The ZTh component of the third term of Formula B also has the $9\omega^2 LC - 1$ in the denominator. This reduces the magnitude of ZTh from that of the base frequency. And Zx at a harmonic conservatively must be assumed to be zero. ZTh, however, appears in an additive sense with R19, as well as other resistive terms. R19 is much larger in size than ZTh, which negates the possible significance in the overall GLoop from reduction in ZTh and Zx. Accordingly, harmonics are decisively suppressed so long as the difference in size between $(\omega^2 LC - 1)$ and $(9\omega^2 LC - 1)$ brings the overall GLoop to less than 1. Since GI need not be particularly high to assure overall circuit reliability, magnitudes for circuit elements may be readily selected to assure suppression of oscillation at the harmonics even though circuit elements are not highly precise. High harmonics are responded to by the corresponding term being much greater, for example, the 5th harmonic brings the term to: $25\omega^2 LC - 1$, which even more decisively inhibits oscillations at such a frequency. Accordingly, this circuit is highly reliable in not breaking into spurious oscillations.

Another performance consideration is with regard to phase. Where the inversion by inverter 1 is imperfect as to phase, crystal 15 will become inductive or capacitive as required to seek an exact 360° reversal around the feedback loop. This is element Zx in Formula B. That term is in the denominator of Formula B, but it is typically a small part of that term, with respect particularly to R19. Furthermore, a reactance in one sense, for example inductive, by Zx is a direct consequence of gain GI having a reactive component. Since GI is a major element of Formula B, the loop gain will not necessarily decrease and, in fact, theoretically ordinarily will increase because the changes in GI predominate. Specifically, Formula B can be solved for the required magnitude of GI by straightforward algebra, setting GLoop to 1, yielding: $-GI \geq (R7+R19+Rx+Zx+ZTh)/[R7 \cdot (-1)/(\omega^2 LC-1)+R19+Rx+Zx+ZTh]$. Ordinarily $(-1)/(\omega^2 LC-1)$ will be around minus one. (The minus sign of GI merely reflects that the amplifier inverts.) Such a decrease in the necessary magnitude of GI insures sufficient gain for oscillation at the desired frequency even where Zx becomes large. Once again, no need appears for precise circuit elements or the like.

The currents in the series circuit of inductor 9 and capacitor 11 are limited by the saturation of inverter 1. These may be large currents but not typically so large as to overheat other circuit elements. Similarly, crystal 15 will not be damaged by over current in the typical circuit because the ratio of resistor 19 to resistor 7 is of primary significance. They may be selected large enough to decisively negate any overcurrent through crystal 15. Current is similarly limited by saturation of inverter 1, at which state the current increases only until the input voltage to the inverter 1 is equal to the output voltage of inverter 1 divided by the gain of inverter 1. (That gain necessarily corresponds to a magnitude just enough to originate oscillations and, accordingly, is at least slightly less than the ordinary active gain.)

It will be apparent that this invention can take various forms.

Accordingly, what is claimed is:

1. An oscillator comprising a substantially fixed-gain logic gate having an input and an output, a first resistor connected between said input and said output of said logic gate, an inductor having a first side and a second side, said first side of said inductor being connected to said output of said logic gate, a capacitor having a first side and second side, said first side of said capacitor being connected to said second side of said inductor, the second side of said capacitor being connected to a source of reference potential, a frequency-control crystal having a first side and a second side, said first side of said crystal being connected to the junction of said inductor and said capacitor, and the second side of said crystal being connected to said input of said logic gate, and a second resistor connected in series with said crystal, in circuit between the junction of said inductor and said capacitor and the input of said logic gate, said second resistor being in addition to any resistance of said crystal.

2. The oscillator as in claim 1 in which the reactance of said inductor is selected to be more than the reactance of said capacitor at the primary frequency defined by said crystal at all parts of the probable ranges of magnitudes of said capacitor and said inductor.

3. An oscillator comprising an inverting logic gate having an input and an output, a first resistance connected between said input and said output of said logic gate, an inductor having a first side and a second side, said first side of said inductor being connected to the output of said logic gate, a capacitor having a first side and second side, said first side of said capacitor being connected to said second side of said inductor, said second side of said capacitor being connected to a source of reference potential, a frequency-control crystal having a first side and a second side, said first side of said crystal being connected to the junction of said inductor and said capacitor, and said second side of said crystal being connected to the input of said logic gate, and a second resistor connected in series with said crystal in circuit between the junction of said inductor and said capacitor and the input of said logic gate, said second resistor being at least large enough in resistance to prevent feedback gain greater than one at harmonic frequencies of the fundamental frequency of said crystal when the resistance of said crystal is negligible.

4. The oscillator as in claim 3 in which said crystal has the characteristic of exhibiting only odd harmonic frequencies.

5. The oscillator as in claim 3 in which the reactance of said inductor is selected to be more than the reactance of said capacitor at the primary frequency defined by said crystal at all parts of the probable ranges of magnitudes of said capacitor and said inductor.

6. The oscillator as in claim 4 in which the reactance of said inductor is selected to be more than the reactance of said capacitor at the primary frequency defined by said crystal at all parts of the probable ranges of magnitudes of said capacitor and said inductor.

* * * * *